(12) United States Patent
Hirler (10) Patent No.: US 7,646,061 B2
(45) Date of Patent: Jan. 12, 2010

(54) POWER SEMICONDUCTOR COMPONENT WITH CHARGE COMPENSATION STRUCTURE AND METHOD FOR PRODUCING THE SAME

(75) Inventor: Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 248 days.

(21) Appl. No.: 11/754,742

(22) Filed: May 29, 2007

(65) Prior Publication Data

US 2007/0272953 A1    Nov. 29, 2007

(30) Foreign Application Priority Data

May 29, 2006   (DE) .................... 10 2006 025 218

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. .................. 257/341; 257/401; 257/E29.13
(58) Field of Classification Search ................ 257/328, 257/341, 342, 401, E29.13
See application file for complete search history.

(56) References Cited

U.S. PATENT DOCUMENTS

| 5,216,275 | A | 6/1993 | Chen |
| 5,668,385 | A | 9/1997 | Bauer et al. |
| 6,630,698 | B1 | 10/2003 | Deboy et al. |
| 6,633,064 | B2 | 10/2003 | Auerbach et al. |
| 6,894,329 | B2 | 5/2005 | Deboy et al. |
| 6,900,109 | B2 | 5/2005 | Onishi et al. |
| 7,576,393 | B2 * | 8/2009 | Ono et al. .................. 257/341 |

FOREIGN PATENT DOCUMENTS

| DE | 19840032 | 11/1999 |
| DE | 10024480 | 11/2001 |
| EP | 1168455 | 6/2001 |
| EP | 1267415 | 12/2002 |

* cited by examiner

*Primary Examiner*—Hoai v Pham
(74) *Attorney, Agent, or Firm*—Dicke, Billig & Czaja PLLC (57) ABSTRACT

A power semiconductor device with charge compensation structure and a method for producing the same is disclosed. In one embodiment, the power semiconductor device has in a semiconductor body a drift path between a body zone and a substrate region. The drift path is divided into drift zones of a first conduction type. A field stop zone is provided having the first conduction type, which is arranged on the substrate region, wherein the net dopant concentration of the field stop zone is lower than that of the substrate region and higher than that of the drift zones.

33 Claims, 9 Drawing Sheets

POWER SEMICONDUCTOR COMPONENT WITH CHARGE COMPENSATION STRUCTURE AND METHOD FOR PRODUCING THE SAME

CROSS-REFERENCE TO RELATED APPLICATIONS

This Utility patent Application claims priority to German Application No. DE 10 2006 025 218.7, filed May 29, 2006, which is herein incorporated by reference.

BACKGROUND

One or more embodiments relate to a power semiconductor device with charge compensation structure and a method for producing the same.

A power semiconductor device is known from the document U.S. Pat. No. 5,216,275. The power semiconductor devices proposed therein have a drift path having drift zones and charge compensation zones, referred to as a composite buffer layer (CB layer). Such charge compensation devices having depletable complementarily doped charge compensation zones in the form of complementarily doped pillars have the disadvantage, in the case of very precise charge compensation and constant doping of the pillars over the depth thereof, that the reverse voltage falls significantly in the event of an alternation of the compensation as a result of current flow of a few amperes in the off-state case when the avalanche case occurs. The reverse characteristic curve, which is initially characterized by a reverse current determined by the intrinsic conduction of the semiconductor material, undergoes transition to the breakdown characteristic curve in the avalanche case and exhibits a "snapback effect" upon additional take-up of a voltage. The snapback effect is characterized by the fact that the reverse voltage decreases significantly even at low currents without the device being destroyed.

The snapback effect or the snapback of the breakdown characteristic curve can be stemmed in charge compensation devices by using a variable doping of the charge compensation zones, as is known from the document DE 198 40 032 C1. However, this solution can be applied only to a limited extent to a technology in which the charge compensation is produced by stacking selectively doped epitaxial layers. For techniques in which the charge compensation zones are effected by introducing trench structures in which the n-type or p-type doping is introduced via trench sidewalls, a variable doping of the charge compensation zones cannot readily be realized, however.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

The invention will now be explained in more detail with reference to the accompanying figures.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention relates to a power semiconductor device with charge compensation structure and a method for producing the same. The power semiconductor device has in a semiconductor body a drift path between a body zone and a substrate region. The drift path is divided into drift zones of a first conduction type and charge compensations zones having a complementary conduction type. In the on-state case, in the drift zones a current path of the drift path forms between the body zone having a complementary conduction type and the substrate region. In the off-state case, the charge compensation zones constrict the current path of the drift path and pinch off the current flow.

One or more embodiments provide a novel concept and a novel structure for power semiconductor devices with charge compensation structure in which a snapback of the breakdown characteristic curve in the avalanche case is shifted beyond the nominal current to higher currents even given constant doping of the charge compensation zones and an additional overvoltage reserve is provided.

One embodiment provides a power semiconductor device with charge compensation structure and a method for producing the same. The power semiconductor device has in a semiconductor body a drift path between a body zone and a substrate region. The drift path is divided into drift zones of a first conduction type, which provide a current path of the drift path between the body zone having a conduction type complementary to the first conduction type and the substrate region having the first conduction type, and into charge compensation zones having the complementary conduction type, which constrict the current path of the drift path. In this case, the power semiconductor device has a field stop zone having the first conduction type, which is arranged on the substrate region, wherein the net dopant concentration of the field stop zone is lower than that of the substrate region and higher than that of the drift zones.

In this power semiconductor device, with the introduction of a field stop zone onto the substrate region, a zone of the first conduction type that is doped somewhat more highly in comparison with the drift zone is provided between the compensation zones, which zone cannot be fully depleted in the off-state case since it is doped more highly than the drift zone. The field stop zone limits the propagation of the space charge zone of the p-n junction between drift zones and charge compensation zones in the field zone region on the substrate region. If, when the current density increases in the avalanche case, the mobile charge carriers compensate for the background charge, the space charge zone can propagate further downward, whereby the power semiconductor device can take up more voltage and the breakdown characteristic curve exhibits the snapback effect only at higher currents.

Thus, by way of example, by using an approximately 8 micrometers μm additional field stop layer having 10 percent additional doping of the first conduction type relative to the doping of the drift zones, the current density until the occurrence of the snapback effect of the breakdown characteristic curve is increased by approximately a factor of 30. Given the same breakdown voltage, the forward resistance nevertheless only increases slightly.

The field stop zone, the net dopant concentration of which lies slightly above that of the drift zone, can be arranged in various ways on the substrate region. In one embodiment of the invention, the field stop zone is arranged below the charge compensation zones and the drift zones of the drift path on the substrate region. Even with this positioning of the field stop zone it can be observed that the snapback effect of the breakdown characteristic curve in the avalanche case is delayed.

A greater effect can be achieved by virtue of the fact that the field stop zone projects into the drift zones in such a way that it is partly arranged between the charge compensation zones. Such an arrangement of the field stop zone is the most effective since it is arranged between the charge compensation zones.

If the charge compensation zones are arranged in trench structures of the semiconductor body, then the charge compensation zones can project up to the substrate region or even right into the substrate region. In that case, the field stop zone projects into the drift zones in such a way that it is arranged completely between the charge compensation zones. The avalanche effect is localized between the substrate region and the charge compensation zones and is distributed between the large-area regions of contact between substrate region and charge compensation region and hence damage to the power semiconductor device prevents destruction by local breakdowns and/or instances of overheating.

In a further embodiment, the net dopant concentration of the field stop zone has, from the substrate region toward the diffusion zones, abrupt stepped transitions with at least one net dopant concentration transition between the substrate region and the field stop zone and a second net dopant concentration transition between field stop zone and drift zones.

Although this stepped transition affords a first improvement with regard to the snapback effect, this influence can be improved further if the net dopant concentration of the field stop zone gradually decreases from a net dopant concentration level at the transition to the substrate region to the net dopant concentration of the diffusion zones. By virtue of this net concentration of the field stop zone that rises slightly into the depth of the semiconductor device, the field stop zone becomes significantly more efficient since then the voltage increases even more continuously with the current density up to higher current densities and at the same time the conductivity increases with increasing depth.

A particular form of this gradual fall of the net dopant concentration from the substrate region toward the drift zones can be achieved by using diffusion processes, such that the field stop zone then has a diffusion profile. Since the field stop zone can have different profiles such as a diffusion profile, a gradually decreasing profile or a stepped profile, hereinafter average net dopant concentrations $N_F$ are understood as average value over the profile of the field stop zone. In one embodiment, the average net dopant concentration $N_F$ of the field stop zone is higher by $2\% \leq (N_F/N_D) \cdot 100\% \leq 50\%$, by $5\% \leq (N_F/N_D) \cdot 100\% \leq 20\%$, than the net dopant concentration $N_D$ of the drift zones. As illustrated by the diagrams below, the greatest possible voltage boosts of the breakdown characteristic curves in the avalanche case arise in these concentration ranges.

The geometric configuration of compensation zones and drift zones for an effective drift path can be embodied in various ways. In one embodiment, the charge compensation zones and the drift zones are arranged alongside one another in strip-type fashion. Moreover, it is also possible for the charge compensation zones and the drift zones to be arranged alongside one another in pillar-type fashion. In both cases, however, the compensation is configured in such a way as to compensate for the horizontal areal occupancies of the charge compensation zones and of the drift zones with regard to their majority charge carriers, such that a complete depletion of the majority charge carriers in the drift zones in the off-state case becomes possible.

The semiconductor body has a highly doped substrate region of the first conduction type on which an epitaxial layer grown in doped fashion is arranged, the epitaxial layer having the net dopant concentration of the field stop zone. A field stop zone having stepped transitions from the substrate region to the field stop zone region and from the field stop zone region to the drift zone regions is formed in this case since the dopant concentration in epitaxial layers can be held at a predetermined constant level. In addition, in this case the dopant during the production of the epitaxy is synchronously incorporated concomitantly into the growing epitaxial layer.

In an alternative embodiment, the semiconductor body has a highly doped substrate region of the first conduction type on which an epitaxial layer grown in undoped fashion is arranged. The dopant of the field stop zone is implanted and/or indiffused into the epitaxial layer. This gives rise to gradually varying net dopant concentration profiles in the region of the field stop zone which, compared with stepped dopant profiles, permit an advantage—as illustrated in the diagrams below—through an increased reverse voltage in the avalanche case.

In a further embodiment, the semiconductor body has a buffer zone composed of field stop zone material between the drift path and the substrate region. The buffer zone results when the charge compensation zones, although reaching into the field stop zone region, do not adjoin the substrate region. While buffer zones of conventional power devices which are designed for taking up relatively high voltages have a dopant concentration that is lower than the doping of the drift zones, in contrast thereto according to the invention the buffer zone is doped like the field stop zone and thus more highly than the drift zones.

In a further embodiment, the drift path has epitaxial layers grown in undoped fashion one on top of another. The epitaxial layers are equipped with correspondingly selectively implanted and/or diffused dopant concentrations in the regions of the drift zones and the charge compensation zones. In the case of this technology, it is also possible to achieve, in addition to the field stop zone on the substrate region, also a variation of the dopant concentrations in the charge compensation zones in order for example to shift the electric field strength that occurs maximally between body zone and drift zone into a central region of the drift zone.

In a further embodiment, the power semiconductor device has in the semiconductor body a trench structure in the form of trenches, the charge compensation zones being arranged in the trench structure. This structure has the advantage over the structure based on grown epitaxial layers that the number of epitaxial layers can be reduced by virtue of only one epitaxial layer being required for the field stop zone and a further epitaxial layer being required for the introduction of the trench structure and hence for the construction of the drift path. Further, a depth of the trench structure can be chosen optimally, such that the charge compensation zones project into the field stop zone. In this case, the charge compensation zones having the complementary conduction type can be implanted and/or indiffused into the walls of the trench structure. Very slender charge compensation zones can be provided with this technique.

Furthermore, the charge compensation zones having the complementary conduction type can be grown epitaxially onto the walls of the trench structure. In this case, the dopant concentration of the charge compensation zones can be adapted relatively exactly to the dopant concentration of the drift zones, which is problematic in the case of implanted and/or indiffused dopants.

If the trench structure is not completely filled by an epitaxial layer on the walls of the trench structure or if the walls of the trench structure only have implanted and indiffused structures, then the trench structures can additionally be filled with a dielectric insulating material. It is also possible to fill the trench structures with an undoped polysilicon.

In order to keep the dopant level of the trench structure or in the walls of the trench structure once the dopant level has been introduced into the charge compensation region, the complementarily doped walls of the trench structure have a diffusion-inhibiting layer, which is formed by a face-centered cubic SiC. However, layers composed of silicon oxide and/or silicon nitride are also suitable as diffusion-inhibiting layers on the complementarily doped trench walls.

In contrast to the cell structures of the power semiconductor device, which are composed of drift zones and charge compensation zones, in one embodiment an edge structure remains free of a field stop zone since more voltage can be taken up in the edge region than the cell array. In this case, the edge structure can be realized by field plates, by rings or by corresponding trench structures. In one embodiment of the power semiconductor device, the edge structure has at least one floating complementarily doped edge compensation zone along the edge of the power semiconductor device. The edge structure may furthermore have an edge passivation layer having a semiconductor oxide, a semiconductor nitride, a DLC, an EOX and/or a silicon carbide.

As already described in the introduction, the net dopant concentration in the charge compensation zones can be varied as a function of the depth and, in a central layer region, correspond to the net dopant concentration of the drift zones in such a way that the drift path layer doping is compensated for. In this connection, drift path layer doping is understood to mean the integral of the doping locations of a horizontal layer of the vertically extending drift path including the drift zone and charge compensation zone regions arranged in the drift path layer. In this case, the drift path layer doping is compensated for when the number of majority charge carriers of the first conduction type in the layer of the drift zone is equal to the number of majority charge carriers of the complementary conduction type in the corresponding layer of the charge compensation zone.

One or more embodiments of a field stop zone disclosed can be used both in power semiconductor devices with a vertical gate structure and in power semiconductor devices with a lateral gate structure. Power semiconductor devices with a vertical gate structure are, however, in which an additional trench structure has a vertical gate oxide, wherein the additional trench structure is filled with a gate electrode material.

In one embodiment, a method for producing a power semiconductor device has the following method processes. The first process involves providing a doped substrate region for a semiconductor body. Such a substrate region may be for example a semiconductor chip position on a semiconductor wafer. There is grown onto the substrate region an epitaxial layer for a field stop zone having a lower dopant concentration than the substrate region. This is followed by growth of a plurality of undoped epitaxial layers alternately with selective doping of the epitaxial layers for a drift path with drift zones having a lower dopant concentration than the field stop zone and with charge compensation zones doped complementarily thereto on the field stop zone. On the top side of the resulting drift path composed of drift zones and complementarily doped charge compensation zones, a top side structure is produced and, on the rear side of the substrate region, a rear side structure is produced in and/or on the semiconductor body in order to complete the power semiconductor device. Finally, electrically conductive electrodes are applied to the top side structure and the rear side structure.

In contrast to U.S. Pat. No. 5,216,275, with the present invention the growth of an epitaxial layer for a field stop zone on the substrate region having a lower dopant concentration than the substrate region and having a higher dopant concentration than the subsequently applied drift zone regions. In this method, a power semiconductor device is realized which has a breakdown characteristic curve which, even at high current densities, initial does not exhibit a "snapback effect", but rather in the avalanche state still permits an overvoltage range which, in conventional devices without such a field stop zone, can lead to the destruction of the device.

While this power semiconductor device is produced by using a multiple epitaxial layer method, alternatively it is also possible to realize a power semiconductor device of this type with the aid of subsequent introduction of trench structures. A method of this type includes growth of an epitaxial layer for a field stop zone on the substrate region having a lower dopant concentration than the substrate region, and growth of a doped epitaxial layer for a drift path having a lower dopant concentration than the field stop zone. In this method, only one epitaxy process is required for the entire drift path. The introduction of the charge compensation zones is achieved technologically by introducing a trench structure. Accordingly, the application of a doped epitaxial layer for a drift path having a drift zone dopant concentration that is lower than the dopant concentration of the doped epitaxial layer for the field stop zone is followed by the introduction of a trench structure into the epitaxial layer for producing charge compensation zones with a trench depth as far as the field stop zone or deeper into the field zone.

A sidewall doping of the trench structure to form complementarily doped charge compensation zones is then carried out. In this case, the sidewall doping may be effected by using ion implantation or sidewall precoating with post-diffusion or by using diffusion from the gas phase. The trench structure can subsequently be filled with a dielectric material. A top side structure and/or a rear side structure can then be produced in and/or on the semiconductor body in order to complete the power semiconductor device. Finally, electrically conductive electrodes are also applied to the top side structure and the rear side structure.

With this method, the depth is not limited and determined by the top side of the field stop zone applied to the substrate region, rather at the depth of the trench structure for the charge compensation zone can reach right into the field stop zone and further as far as the substrate region.

A further alternative method for producing a power semiconductor device has the following method processes. Firstly, as in the preceding method variants, a doped substrate region is provided for a semiconductor body having a top side and a rear side and there is grown on the substrate region an epitaxial layer for a field stop zone having a lower dopant concentration than the substrate region.

As in the preceding example, this is then followed by the growth of a doped epitaxial layer for a drift path with drift zones which have a lower dopant concentration than the field stop zone. Finally, there is introduced into this or into both epitaxial layers a trench structure for charge compensation zones with a trench depth as far as the field stop zone or into the field zone. Afterward, a complementarily conductive epitaxial layer is grown whilst filling the trench structure for charge compensation zones. The basic structure for the drift path is thus produced, and a top side structure and/or a rear side structure can then be produced in and/or on the semiconductor body in order to complete the power semiconductor device. Finally, once again electrically conductive electrodes are applied to the top side structure and the rear side structure.

In one embodiment, the trench structure is simultaneously filled again with the production of the charge compensation zones. Moreover, the dopant concentration for the charge compensation zones can be adapted very precisely to the dopant concentration of the previously created drift zone regions by using such an epitaxial layer.

In a further exemplary implementation of the method, a donor that diffuses slowly in a semiconductor body, arsenic, is used as substrate doping and, prior to the growth of an epitaxial layer for a field stop zone, a rapidly diffusing donor, phosphorus, is additionally implanted into the top side of the doped substrate region. This means that during the subsequent growth of the epitaxial layer for the field stop zone, the additional donor indiffuses into the growing epitaxial layer and a gradual boosting of the doping for the field zone is formed with a gradually decreasing diffusion profile toward the drift zone. This method provides that a gradual and slow transition of the dopant concentration from the substrate region to the drift zones can be provided for the field stop zone.

In one embodiment, prior to the implantation of an additional donor, the edge regions are covered with an ion implantation mask, such that no field stop zone is formed in the covered edge regions during the subsequent growth of an epitaxial layer for the field stop zone. With this method, the edge regions are protected before a field stop layer is formed.

In one embodiment, for the doping of the epitaxial layer for the field stop zone, a rear side diffusion with hydrogen and subsequently a heat treatment at elevated temperature are carried out, such that additional n-doped impurities are produced in particular in the region of the field stop zone. Such a rear side diffusion can be performed over the whole area, but the edge regions are not protected before a field stop zone is formed.

Furthermore, for doping the epitaxial layer for the field stop zone (11), impurities can be introduced into that region of the substrate which is near the top side prior to growth of an epitaxial layer, the diffusion coefficient of the impurities introduced being greater than the diffusion coefficient of the impurities arranged at substitution lattice sites in the substrate. The impurities having a higher diffusion coefficient, during the growth of an epitaxial layer for the field stop zone, indiffuse into the epitaxial layer from the region near the top side and introduce a diffusion profile into the field stop zone.

In one embodiment, a highly doped semiconductor wafer having a plurality of power semiconductor chip positions arranged in rows and columns is used as substrate region of a semiconductor body for the simultaneous production of a plurality of power semiconductor devices. With a semiconductor wafer of this type, the edge regions of the respective power semiconductor chips can be covered in the semiconductor chip positions, such that no field stop zones arise in the edge regions.

If trench structures are provided for the production of a power semiconductor device, a structured auxiliary layer is applied, in regions of the trench structure to be etched, prior to the growth of an epitaxial layer of the first conduction type for the drift path on the substrate or onto the field stop zone. This structured auxiliary layer enables an etching stop and one embodiment includes a semiconductor oxide or semiconductor nitride. In this case, the structure of the auxiliary layer is applied, in the regions of the trench structure to be etched, in a fine structure such that a lateral monocrystalline overgrowth of the fine structure is made possible.

Furthermore, for introducing the trench structure into the epitaxial layer of the first conduction type, an etching mask with strip-type patterns can be applied photolithographically in the region of the drift path, such that as a result strip-type drift zones and strip-type charge compensation zones lie alongside one another as drift paths. As an alternative, it is possible to photolithographically apply an etching mask with square or hexagonal patterns in the region of the drift path. In this case, a pillar-type trench structure arises, which is equipped with charge compensation zones later. An anisotropic etch, an anisotropic reactive ion etch, a directional plasma etch or a directional plasma etch with end point detection can be carried out for introducing such trench structures. In one embodiment, the surfaces of the trench structure are chemically cleaned after the introduction of the trench structure and prior to the doping of the trench structure walls. Furthermore, it is possible, for the preparation of the trench walls, to oxidize the entire top side of the semiconductor body and subsequently to etch away the oxide layer. It is also possible for the walls of the trench structure to be smoothed by using a hydrogen heat treatment process before the trench walls are doped.

Furthermore, prior to the growth of an epitaxial layer or the indiffusion of a dopant of the complementary conduction type in the trench structure, the trench structure walls can be etched in such a way that they have a bevel, such that the width of the trench structure at the top side of the semiconductor body becomes greater than in the bottom wall region of the trench structure.

For doping the trench structure walls, in one embodiment, a dopant layer of a dopant glass having dopant atoms of the complementary conduction type is deposited on the trench walls. Afterward, the dopant of the layer is indiffused into the trench walls in order to form the charge compensation zones and the dopant layer is removed again after a diffusion process.

Instead of a dopant source in the form of a dopant layer, in an alternative method for the production of the charge compensation zones, an epitaxial layer is grown on the trench walls with a thickness d of between 100 nm$\leq$d$\leq$1000 nm, 200 nm$\leq$d$\leq$600 nm. For doping the trench structure walls from an additionally applied epitaxial layer or the trench structure of an original epitaxial layer, a predoping from the gas phase with subsequent post-diffusion can be effected in order to produce charge compensation zones. Moreover, in one embodiment, the doping of the trench structure walls to form charge compensation zones, a diffusion-inhibiting layer made of an amorphous silicon or a face-centered cubic silicon carbide is deposited on the areas of the trench structure with a thickness 10 nm$\leq$d 300 nm, 50 nm$\leq$d$\leq$150 nm.

For these and other reasons there is a need for the present invention.

Figure 1:
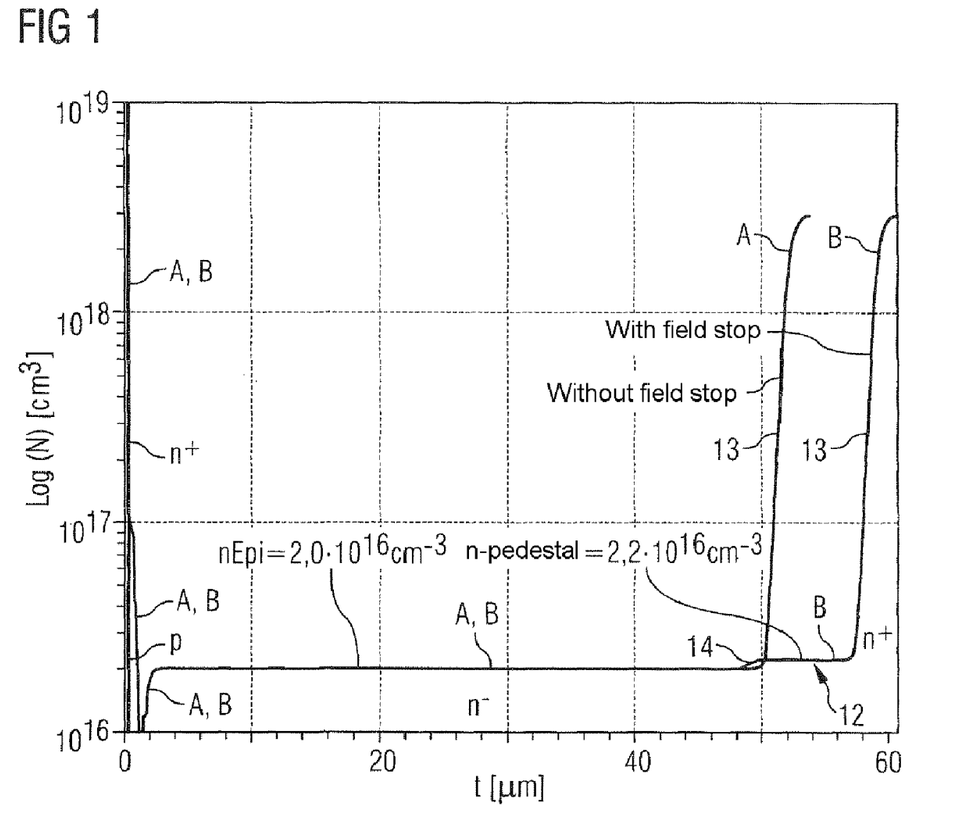
FIG. 1 illustrates a schematic diagram with a net dopant profile of a power semiconductor device without a field stop zone in comparison with a power semiconductor device with a field stop zone.

FIG. 1 illustrates a schematic diagram of a net dopant profile A of a power semiconductor device without a field stop zone in comparison with a net dopant profile B of a power semiconductor device with a field stop zone. For this purpose, on the abscissa the depth t in micrometers (µm) is plotted beginning with zero at the top side of the semiconductor body in the direction toward the net dopant transition 13 to the substrate. Both net dopant profiles initially coincide and exhibit at the top side of the semiconductor body at t=0 a concentration of greater than $10^{19}$ cm$^{-3}$ for the source region, subsequently a concentration of approximately at most $10^{17}$ cm$^{-3}$ for the complementarily conductive body zone, and finally a concentration of approximately $2 \cdot 10^{16}$ cm$^{-3}$ for the n$^-$-conducting epitaxial layer of the drift zones of the drift path. The net dopant profiles A and B differ at a depth t of greater than 50 µm. At a depth t of approximately 50 µm, the net dopant profile A for a power semiconductor component without a field stop zone exhibits a steep rise to approximately $3 \cdot 10^{18}$ cm$^{-3}$ of an n$^+$-conducting substrate region. Starting from 50 µm, the power semiconductor device with a field stop zone has a pedestal doping of the field stop zone with processed transition 12, which here is in two processes with a net dopant transition 14 from $2 \cdot 10^{16}$ cm$^{-3}$ of the drift zone to the field stop zone concentration of the n-type pedestal with $2.2 \cdot 10^{16}$ cm$^{-3}$ and a steep net dopant transition 13 to the doping of the n$^+$-conducting substrate region.

Figure 2:
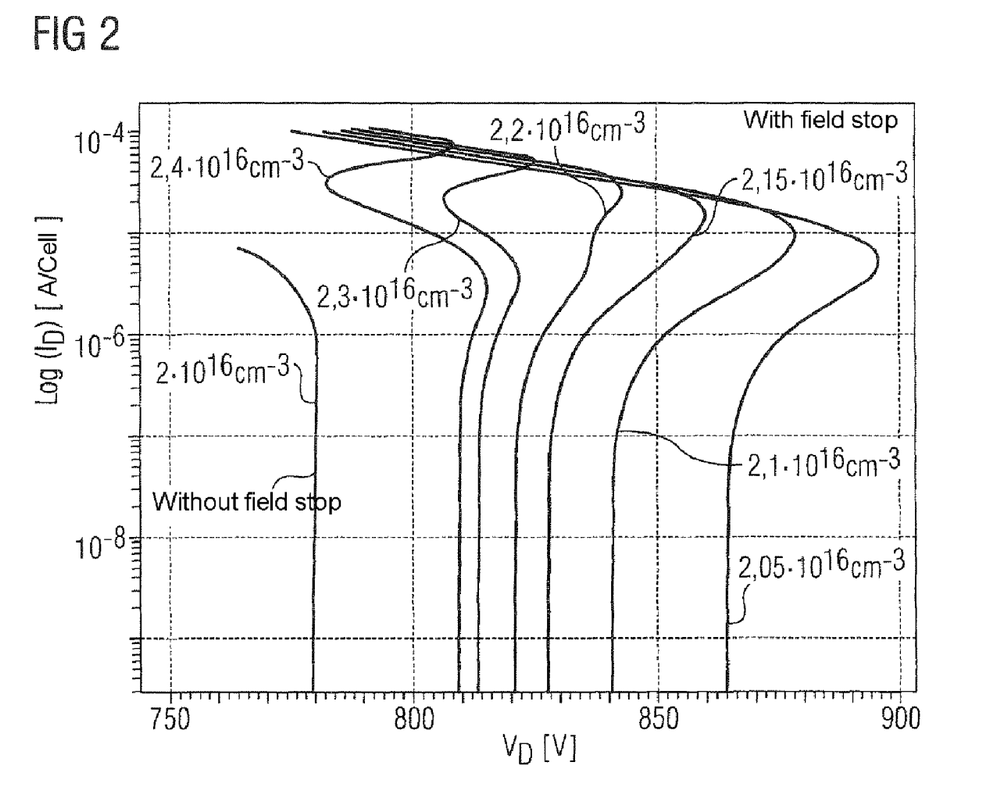
FIG. 2 illustrates a schematic diagram of the reverse currents in the region of the breakdown characteristic curve of power semiconductor devices with a field stop zone in comparison with a power semiconductor device without a field stop zone.

FIG. 2 illustrates a schematic diagram of the reverse currents in the region of the breakdown characteristic curve of power semiconductor devices with a field stop zone in comparison with a power semiconductor device without a field stop zone. For this purpose, the drain voltage $V_D$ in volts is plotted on the abscissa and the reverse current density $I_D$ per cell on a logarithmic scale is plotted on the ordinate. In the case of a power semiconductor device without a field stop, in this example the "snapback effect" already becomes effective at $10^{-6}$ A/µm$^2$. This current density is identified by a broken line in the diagram. The locking capability of the power semiconductor device in the avalanche case is accordingly limited for conventional power semiconductor devices. The power semiconductor devices with a field stop zone doping of $2.05 \cdot 10^{16}$ cm$^{-3}$ (curve on the far right) to $2.4 \cdot 10^{16}$ cm$^{-3}$ have a voltage reserve, such that the snapback effect clearly occurs at higher avalanche current densities. It is striking here that in the case of a minimal overdoping of only 2.5 percent of the curve on the far right in the diagram a greater voltage reserve is available than in the case of a dopant boosting in the field stop region of 20 percent.

Figure 3:
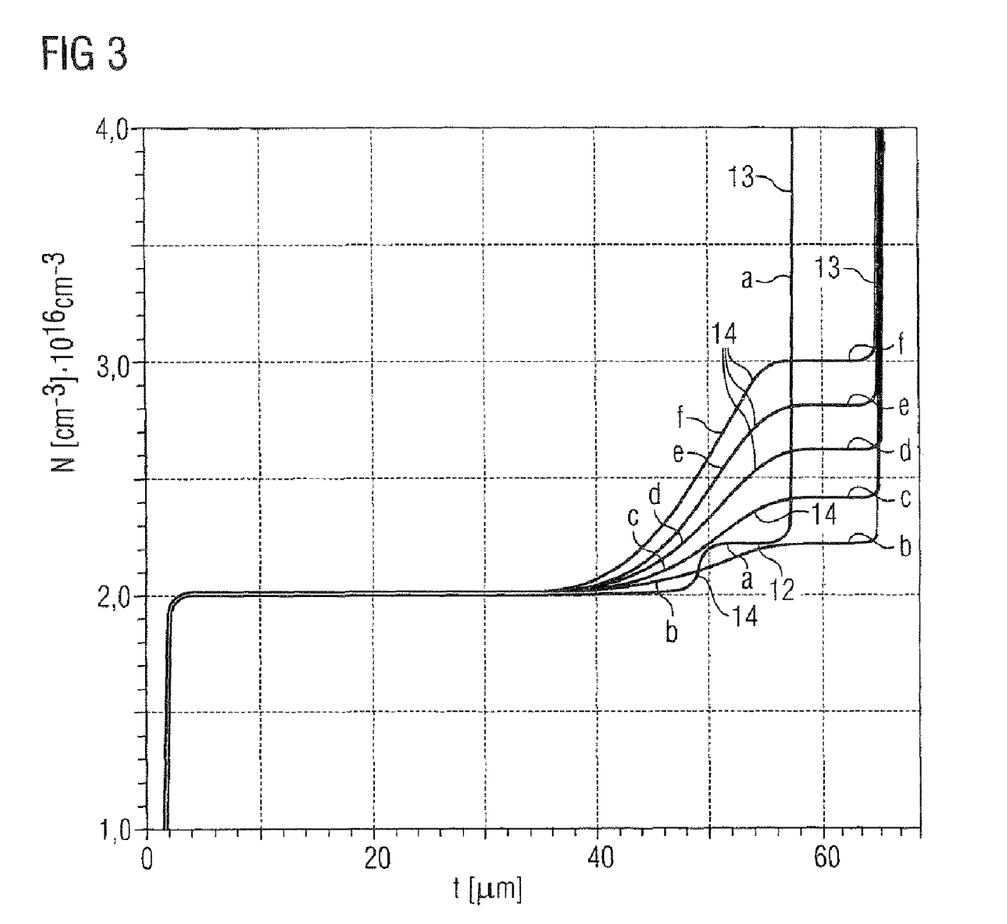
FIG. 3 illustrates a schematic diagram with net dopant profiles of different field stop zones.

FIG. 3 illustrates a schematic diagram with net dopant profiles a to f of differently doped field stop zones. The net dopant concentration N is plotted on a linear scale on the ordinate and the depth t in micrometers is plotted on the abscissa. In this case, the dopant profile a exhibits two stepped transitions 14 and 13. The remaining net dopant profiles b to f have only a single stepped transition 13 from the substrate doping to the field stop zone doping. The transition 14 is a gradual transition corresponding to a Gaussian diffusion profile. The latter is established if a doping of an epitaxially applied field stop zone is followed by further high-temperature processes, such as the growth of a further epitaxial layer for the drift path or a high-temperature process for the outdiffusion of dopants from the previously applied field stop zone.

Such profiles b to f can also be formed by using a donor having a low diffusion coefficient, such as arsenic, for the substrate region and implanting a donor having a high diffusion coefficient, such as phosphorus, into the surface of the substrate region prior to the growth of an epitaxial layer. There then arises automatically, proceeding from the top side of the substrate region, a diffusion profile in the epitaxial layer growing thereon, which diffusion profile firstly forms a field stop zone and, with increasingly growing epitaxial material, falls under the basic doping of the epitaxy, which here is $2 \cdot 10^{16}$ cm$^{-3}$.

Figure 4:
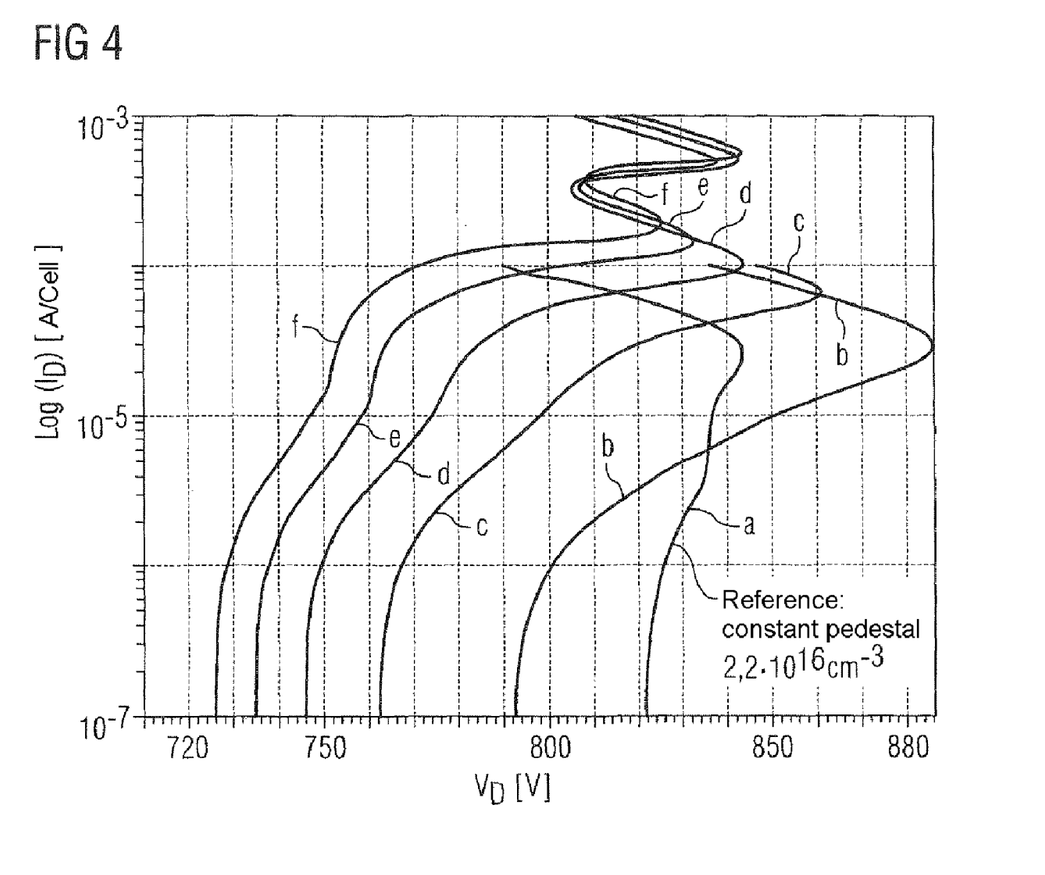
FIG. 4 illustrates a schematic diagram with the reverse currents in the region of breakdown characteristic curves of the net dopant profiles of differently doped field stop zones that are illustrated in FIG. 3.

FIG. 4 illustrates a schematic diagram with the avalanche current densities $I_D$ per cell in the region of breakdown characteristic curves of the net dopant profiles a to f illustrated in FIG. 3. For this purpose, the avalanche current density $I_D$ is represented on a logarithmic scale on the ordinate and the drain voltage $V_D$ in volts is plotted on the abscissa. In this illustration, the net dopant profile a having a stepped transition and a dopant boosting of 10 percent serves as a reference. Here, too, it can clearly be seen that there is initially a voltage reserve present before the snapback effect commences. Given the same net dopant boosting of 10 percent, but with a gradual fall to the dopant concentration of the drift zone, a significantly greater voltage boosting is produced in the avalanche case before the destructive snapback effect can commence. The highest possible avalanche current density in this comparison is exhibited by the dopant curve f, which gradually reaches an avalanche current density of approximately $5 \cdot 10^4$ A/cell given a dopant boosting of 50 percent with a dopant concentration N of $3 \cdot 10^{16}$ cm$^{-3}$ and a gradual dopant fall to the dopant concentration of the drift cells of $2 \cdot 10^{16}$ cm$^{-3}$, without the power semiconductor device being damaged by the snapback effect.

Figure 5:
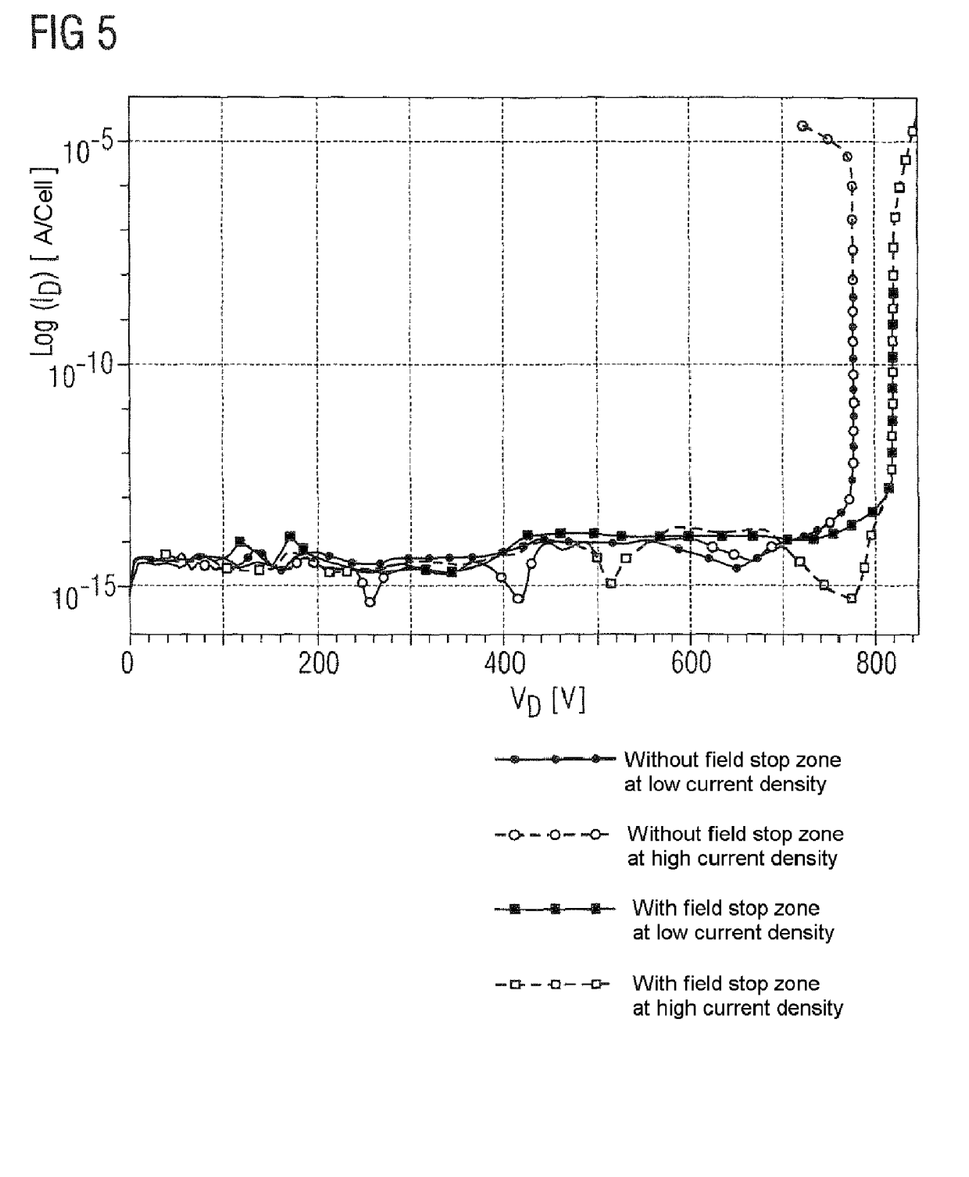
FIG. 5 illustrates a schematic diagram of reverse current characteristic curves into the regions of the breakdown characteristic curves for a power semiconductor component with a field stop zone in comparison with a power semiconductor component without a field stop zone.

FIG. 5 illustrates a schematic diagram of reverse current characteristic curves into the region of the breakdown characteristic curves in the avalanche case for a power semiconductor device with a field stop zone in comparison with a power semiconductor device without a field stop zone. For this purpose, the drain voltage $V_D$ is plotted on the abscissa and the drain reverse current $I_D$ per cell is plotted on a logarithmic scale in amperes per cell (A/cell) on the ordinate. The breakdown behavior at high current density and at low current density is investigated for both cases. In this respect, it is noticeable that at low current density the breakdown characteristic curves for power semiconductor devices with and without a field stop zone run parallel and it is only at high current densities that the breakdown characteristic curves drift apart by virtue of a voltage reserve being built up in power semiconductor devices with a field stop zone, whereas in the power semiconductor device without a field stop zone an inflection in the direction of damage to the power semiconductor device on account of the snapback effect can be observed since the drain voltage $V_D$ collapses.

Figure 6:
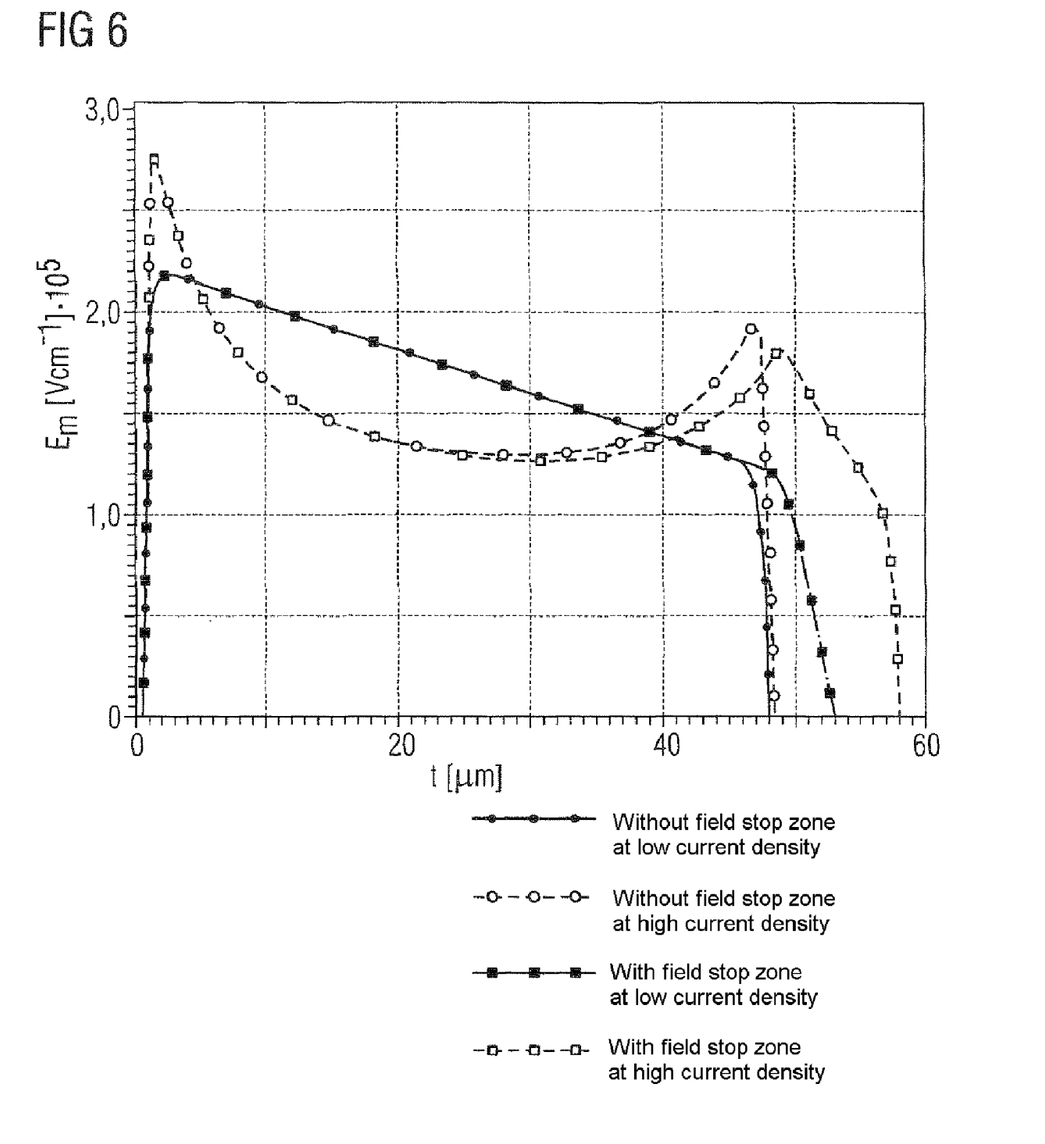
FIG. 6 illustrates a schematic diagram of the profile of the electric field strength for a power semiconductor device with field stop zone in comparison with a power semiconductor device without a field stop zone.

FIG. 6 illustrates a schematic diagram of the profile of the electric field strength for a power semiconductor device with a field stop zone in comparison with a power semiconductor device without a field stop zone. This time the penetration depth t in micrometers (μm) is represented on the abscissa and the field strength in $V/cm \cdot 10^5$ is represented on the ordinate. The solid lines illustrate the field profile, which, both for the power semiconductor device without a field stop zone and for the power semiconductor device with a field stop zone, has a highest value in the region near the surface during the transition between body zone and source zone, but otherwise proceeds identically for both power semiconductor devices. However, the space charge zone can propagate deeper into the semiconductor body if a field stop zone is provided. This becomes even clearer when the field strength is considered against the penetration depth for higher current densities, which is identified by the dashed curves. Whereas without a field stop zone the same depth is reached for high current densities as well, the field profile for power semiconductor devices with a field stop zone reaches deeper into the semiconductor body, with the result that a higher voltage reserve is produced.

Figure 7:
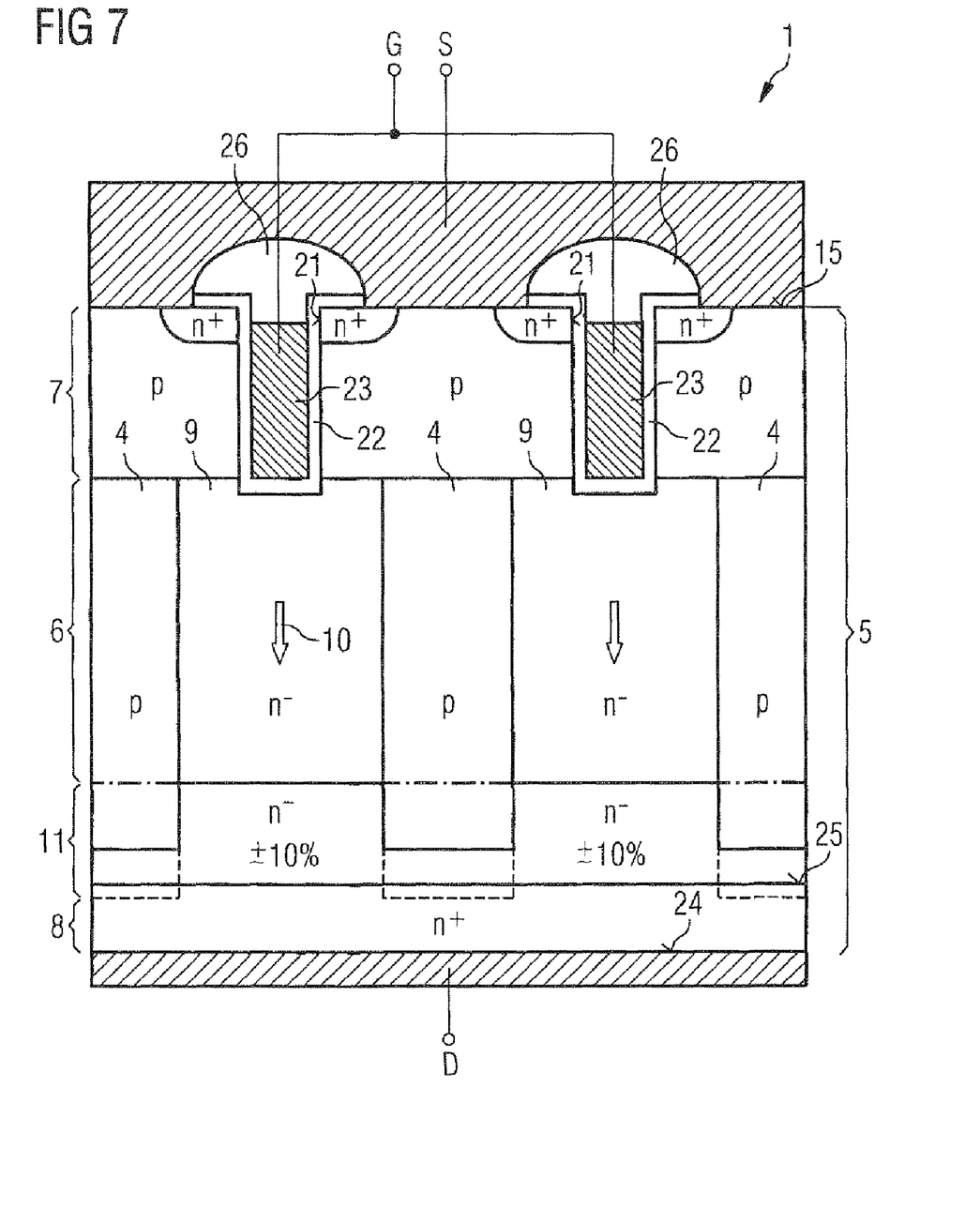
FIG. 7 illustrates a schematic cross section through a cell of a power semiconductor device of a first embodiment of the invention.

FIG. 7 illustrates a schematic cross section through a cell of a power semiconductor device 1 of a first embodiment. This power semiconductor device 1 has a semiconductor body 5 having a top side 15 and an underside 24, which semiconductor body is constructed from a substrate region 8, a field stop zone 11 arranged on the top side 25 of the substrate region, and a drift path 6 arranged above that, and a body zone 7 finally reaching as far as the top side 15 of the semiconductor body 5. A source electrode S is connected on the top side 15 of the semiconductor body, while a drain electrode D is present on the underside 24 of the semiconductor body 5 in this embodiment. The drift path 6 alternately has charge compensation zones 4 and drift zones 9, wherein a current path 10 is formed in the drift zones 9 in the on-state case, which current path is constricted and pinched off by the charge compensation zones 4 in the off-state case.

Above the drift path 6, the body zone 7 is arranged in a complementarily conductive material of a body zone 7 with respect to the drift zones 9, a vertical gate structure in a trench 21 extending through the body zone. The gate structure has a gate oxide 22 and a gate electrode material 23 made of polycrystalline silicon, which fills the trench 21 up to an oxide cap 26 that insulates the gate electrode material 23 of the gate electrode G from the source electrode S. In this embodiment, the field stop zone 11 having an approximately 10 percent net dopant boosting projects into the drift zones 9, such that the field stop zone 11 is arranged between the compensation zones 4 in the lower region of the drift path 6. This affords the advantages discussed above, as have been illustrated with the aid of diagrams 1 to 6. In this case, the charge compensation zone 4 may for example also reach only as far as the dash-dotted line and thus only touch the field stop zone 11, or it may reach to a depth such that it extends right into the substrate region 8, as is marked by the dashed line. The different production methods by which a power semiconductor device of this type can be fabricated have already been discussed above, and so a renewed explanation is unnecessary.

Figure 8:
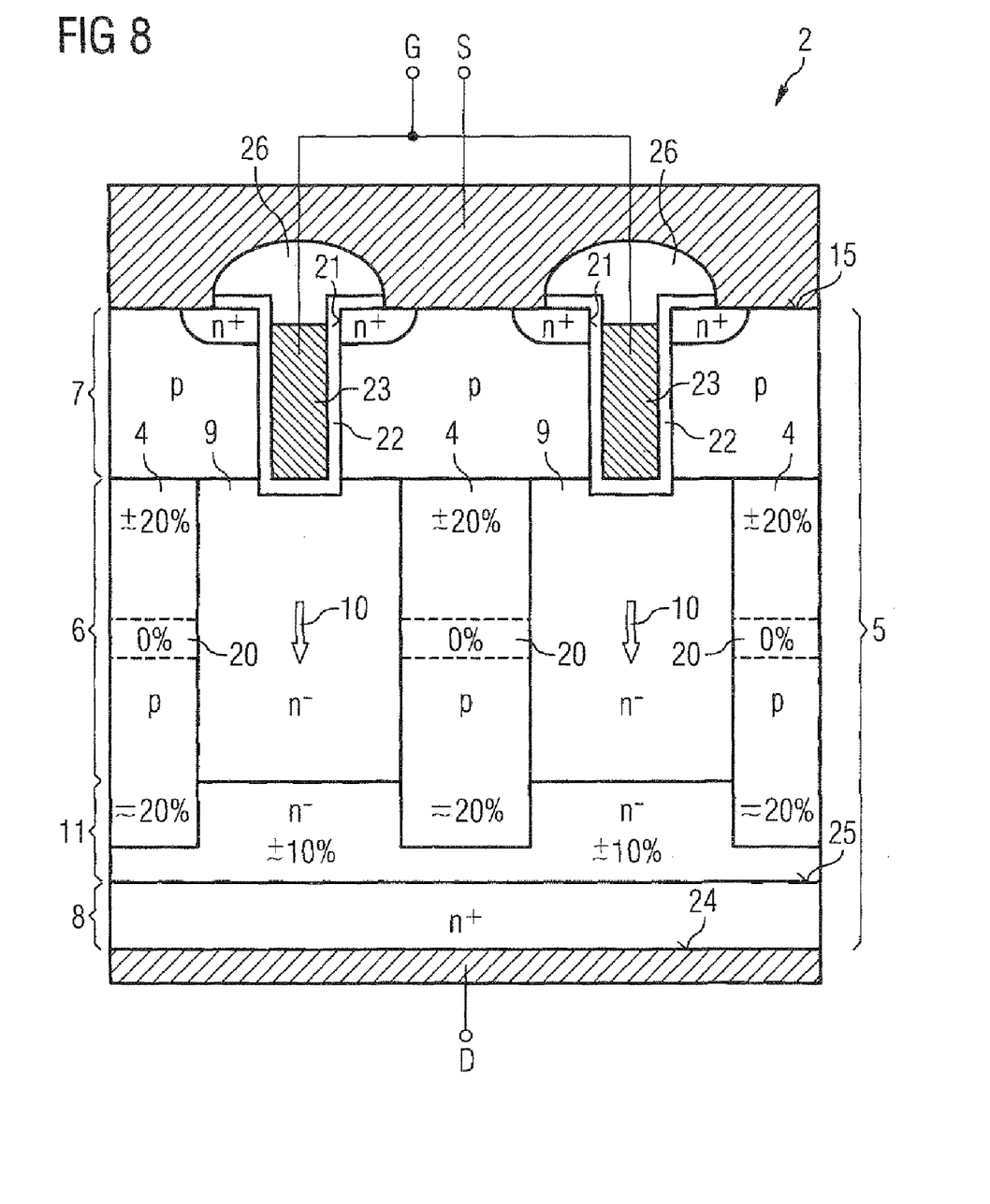
FIG. 8 illustrates a schematic cross section through a cell of a power semiconductor device of a second embodiment of the invention.

FIG. 8 illustrates a schematic cross section through a cell of a power semiconductor device 2 of a second embodiment. Components having the same functions as in FIG. 1 are identified by the same reference symbols and are not discussed separately. The difference with respect to the first embodiment is that now the net dopant concentration in the charge compensation zones 4 is varied as a function of the depth in such a way that in a central layer region 20, the net dopant concentration of the drift zones 9 corresponds to the net dopant concentration of the charge compensation zones 4, with the result that the drift path layer doping is compensated for. By contrast, in the charge compensation zones 4 a charge carrier boosting by 20%, for example, is provided in the vicinity of the body zone and a charge carrier reduction by 20% is provided in the vicinity of the substrate region. This results in a field strength maximum in the central layer region 20 of the charge compensation zones 4. By contrast, the net dopant concentration in the drift zones 9 remains constant until the field stop zone 11 is reached.

Figure 9:
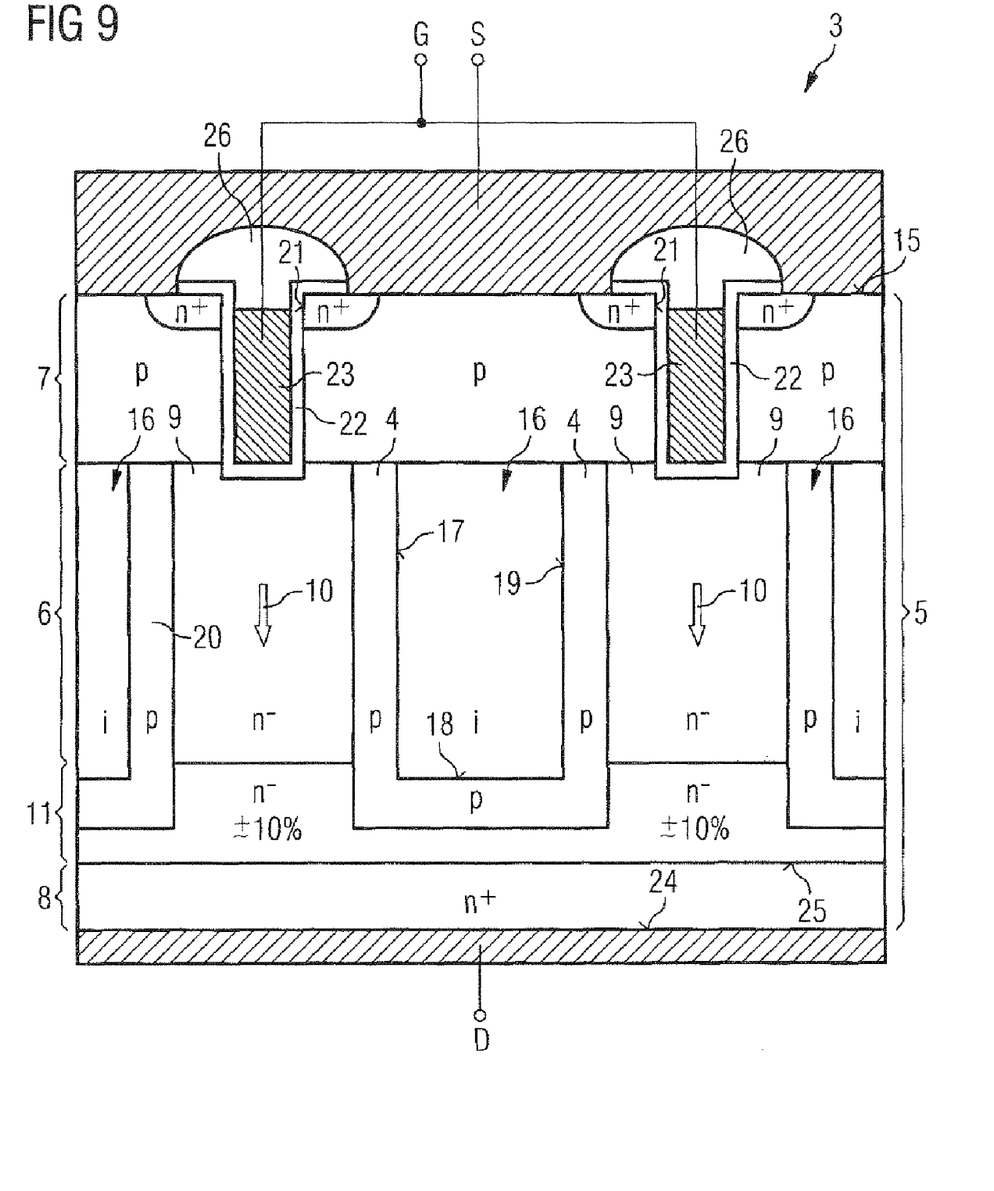
FIG. 9 illustrates a schematic cross section through a cell of a power semiconductor device of a third embodiment of the invention.

FIG. 9 illustrates a schematic cross section through a cell of a power semiconductor device 3 of a third embodiment. Components having the same functions as in the previous figures are identified by the same reference symbols and are not explained in any greater detail. The difference with respect to the previous embodiments consists in the fact that the charge compensation zones 4 are arranged in a trench structure 16, the sidewalls 17 and 19 and also the bottom wall 18 being doped with a complementary conduction type with respect to the drift zones 9, while the trench volume itself is filled by a dielectric i.

Since a trench structure 16 of this type can be introduced to any desired depth into the semiconductor body 5, the depth variation possibilities illustrated in FIG. 1 can be realized particularly simply with trench structures 16 of this type. A further advantage is that for constructing the drift path 6, only one epitaxial layer has to be grown on the top side of the field stop zone 11 and the trench structure 16 can be etched to any desired depths to as far as the substrate region 8 by using a single etching process. The techniques that make this possible have already been listed above, and so a repetition is unnecessary. Further variants with regard to how such trench structures 16 are to be cleaned and configured have also already been discussed above and are therefore not repeated again here.

For all three embodiments in accordance with FIGS. 7, 8 and 9 it holds true that the epitaxial layer, apart from in the edge zone of the power semiconductor devices 1, 2 and 3, is grown and doped in boosted fashion relative to the drift zones 9. This dopant boosting lies between 2% and 50%, between 5% and 20%.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor device with charge compensation structure comprising:
    a semiconductor body a drift path between a body zone and a substrate region, the drift path having drift zones of a first conduction type; and
    a field stop zone having the first conduction type, which is arranged on the substrate region, and wherein the net dopant concentration of the field stop zone is lower than that of the substrate region and higher than that of the drift zones.

2. The power semiconductor device of claim 1, comprising charge compensation zones having the complementary conduction type wherein the field stop zone is arranged below the charge compensation zones and the drift zones of the drift path on the substrate region.

3. The power semiconductor device of claim 1, wherein the field stop zone projects into the drift zones such that it is at least partly arranged between the charge compensation zones.

4. The power semiconductor device of claim 1, wherein the net dopant concentration of the field stop zone comprises, from the substrate region toward the diffusion zones, abrupt processed transitions with at least one net dopant concentration transition between the substrate region and the field stop zone and a second net dopant concentration transition between field stop zone and drift zones.

5. The power semiconductor device of claim 1, wherein the net dopant concentration of the field stop zone gradually decreases from a net dopant concentration level at the transition to the substrate region to the net dopant concentration of the diffusion zones.

6. The power semiconductor device of claim 5, wherein the net dopant concentration of the field stop zone comprises a diffusion profile.

7. The power semiconductor device of claim 5, wherein the average net dopant concentration of the field stop zone is higher by $2\% \leq (N_F/N_D) \cdot 100\% \leq 200\%$, by $5\% \leq (N_F/N_D) \cdot 100\% \leq 50\%$, than the net dopant concentration of the drift zones.

8. A power semiconductor device with charge compensation structure comprising:
    a semiconductor body a drift path between a body zone and a substrate region;
    the drift path having drift zones of a first conduction type, which provide a current path of the drift path between the body zone having a conduction type complementary to the first conduction type and the substrate region having the first conduction type;
    charge compensation zones having the complementary conduction type, which constrict the current path of the drift path; and
    a field stop zone having the first conduction type, which is arranged on the substrate region, and wherein the net dopant concentration of the field stop zone is lower than that of the substrate region and higher than that of the drift zones.

9. The power semiconductor device of claim 8, wherein the field stop zone is arranged below the charge compensation zones and the drift zones of the drift path on the substrate region.

10. The power semiconductor device of claim 8, wherein the field stop zone projects into the drift zones in such a way that it is partly arranged between the charge compensation zones.

11. The power semiconductor device of claim 8, wherein the field stop zone projects into the drift zones in such a way that it is arranged for the most part between the charge compensation zones.

12. The power semiconductor device of claim 8, wherein the field stop zone projects into the drift zones in such a way that it is arranged completely between the charge compensation zones.

13. The power semiconductor device of claim 8, wherein the net dopant concentration ($N_F$) of the field stop zone comprises, from the substrate region toward the diffusion zones, abrupt processed transitions with at least one net dopant concentration transition between the substrate region and the field stop zone and a second net dopant concentration transition between field stop zone and drift zones.

14. The power semiconductor device of claim 8, wherein the net dopant concentration of the field stop zone gradually decreases from a net dopant concentration level at the transition to the substrate region to the net dopant concentration of the diffusion zones.

15. The power semiconductor device of claim 13, wherein the net dopant concentration ($N_F$) of the field stop zone comprises a diffusion profile.

16. The power semiconductor device of claim 8, wherein the average net dopant concentration of the field stop zone is higher by $2\% \leq (N_F/N_D) \cdot 100\% \leq 200\%$, by $5\% \leq (N_F/N_D) \cdot 100\% \leq 50\%$, than the net dopant concentration of the drift zones.

17. The power semiconductor device of claim 8, wherein the average net dopant concentration of the field stop zone does not exceed the values $N_F = 3 \cdot 10^{16}$ cm$^{-3}$ to $5 \cdot 10^{16}$ cm$^{-3}$, in particular.

18. The power semiconductor device of claim 8, wherein the charge compensation zones and the drift zones are arranged alongside one another in strip-type fashion.

19. The power semiconductor device of claim 8, wherein the charge compensation zones and the drift zones are arranged alongside one another in pillar-type fashion.

20. The power semiconductor device of claim 8, wherein the semiconductor body comprises a highly doped substrate region of the first conduction type on which an epitaxial layer grown in doped fashion is arranged, the epitaxial layer comprising the net dopant concentration of the field stop zone.

21. The power semiconductor device of claim 8, wherein the semiconductor body comprises a highly doped substrate region of the first conduction type on which an epitaxial layer grown in undoped fashion is arranged, the dopant of the field stop zone being implanted or indiffused into the epitaxial layer.

22. The power semiconductor device of claim 8, wherein the semiconductor body comprises a buffer zone composed of field stop zone material between the drift path and the substrate region, wherein the charge compensation zones extend in their depth from the top side of the semiconductor body as far as the buffer zone.

23. The power semiconductor device of claim 8, wherein the drift path comprises epitaxial layers grown in undoped fashion one on top of another, the epitaxial layers comprising correspondingly selectively implanted and/or diffused dopant concentrations in the regions of the drift zones and the charge compensation zones.

24. The power semiconductor device of claim 8, wherein the power semiconductor device comprises in the semiconductor body a trench structure in the form of trenches, the charge compensation zones being arranged in the trench structure.

25. The power semiconductor device of claim 24, wherein the charge compensation zones having the complementary conduction type are implanted and/or indiffused into the walls of the trench structure.

26. The power semiconductor device of claim 24, wherein the charge compensation zones having the complementary conduction type are grown epitaxially onto the walls of the trench structure.

27. The power semiconductor device of claim 8, wherein the trench structure is additionally filled with a dielectric material.

28. The power semiconductor device of claim 8, wherein the complementarily doped walls of the trench structure comprise, toward the filled material in the trench structure, a diffusion-inhibiting crystalline layer comprising face-centered cubic SiC.

29. The power semiconductor device of claim 8, wherein the power semiconductor device comprises an edge structure that is free of a field stop zone.

30. The power semiconductor device of claim 29, wherein an edge structure is arranged in the edge region of the semiconductor body of the power semiconductor device and comprises at least one floating complementarily doped edge compensation zone along the edge of the power semiconductor device.

31. The power semiconductor device of claim 29, wherein the edge structure has an edge passivation layer having a semiconductor oxide, a semiconductor nitride, a DLC, an EOX and/or a silicon carbide.

32. The power semiconductor device of claim 8, wherein the net dopant concentration in the charge compensation zones varies as a function of the depth and, in a central layer region, corresponds to the net dopant concentration of the drift zones in such a way that the drift path layer doping is compensated for.

33. The power semiconductor device of claim 8, wherein the power semiconductor device has a trench structure with a vertical gate oxide, the trench structure being filled by gate electrode material.

* * * * *